United States Patent
Viehmann et al.

(10) Patent No.: US 6,847,225 B2
(45) Date of Patent: Jan. 25, 2005

(54) CML (CURRENT MODE LOGIC) OCD (OFF CHIP DRIVER)—ODT (ON DIE TERMINATION) CIRCUIT FOR BIDIRECTIONAL DATA TRANSMISSION

(75) Inventors: Hans-Heinrich Viehmann, S. Burlington, VT (US); Stefan Lammers, South Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/394,779

(22) Filed: Mar. 21, 2003

(65) Prior Publication Data

US 2004/0183565 A1 Sep. 23, 2004

(51) Int. Cl.[7] ................... H03K 17/16; H03K 19/003; H03K 19/0175; H03K 19/094
(52) U.S. Cl. ................................ 326/30; 326/86
(58) Field of Search ............... 326/30, 82, 86, 326/127; 710/2, 106; 333/4, 22 R, 125; 375/257

(56) References Cited

U.S. PATENT DOCUMENTS

| | | | | |
|---|---|---|---|---|
| 4,553,050 A | * | 11/1985 | Feinberg et al. | 326/30 |
| 4,859,877 A | * | 8/1989 | Cooperman et al. | 326/30 |
| 6,275,062 B1 | * | 8/2001 | Starr | 326/30 |
| 6,323,673 B1 | * | 11/2001 | Starr | 326/30 |
| 6,429,679 B1 | * | 8/2002 | Kim et al. | 326/30 |
| 6,541,998 B2 | * | 4/2003 | Manapat et al. | 326/30 |
| 6,636,069 B1 | * | 10/2003 | Muljono | 326/30 |
| 6,670,830 B2 | * | 12/2003 | Usami et al. | 326/86 |

OTHER PUBLICATIONS

Kim et al., "Programmable and Automatically On–Die Terminator for DDR3–SRAM Interface," 2003, IEEE, p. 391–39.*

* cited by examiner

Primary Examiner—Patrick Wamsley
(74) Attorney, Agent, or Firm—Slater & Matsil, L.L.P.

(57) ABSTRACT

An apparatus for use as both an off chip driver (OCD) and an on die termination (ODT) circuits. A preferred embodiment comprises a control circuit (for example, control circuit 305) coupled to a dual function OCD/ODT circuit (for example, OCD/ODT circuit 330) with an enable line coupled to the control circuit. The control circuit may be used to selectively choose OCD and ODT functionality based on a value on the enable line. With the control circuit choosing OCD, the dual function OCD/ODT circuit functions as an OCD circuit, placing signals provided through the control circuit onto a transmission line. With the control circuit choosing ODT, the dual function OCD/ODT circuit becomes terminating resistors for incoming signals on a transmission line. The use of a single circuit for both OCD and ODT functions can save both integrated circuit real-estate and implementation costs due to a reduction in use of circuit elements.

29 Claims, 4 Drawing Sheets

CML (CURRENT MODE LOGIC) OCD (OFF CHIP DRIVER)—ODT (ON DIE TERMINATION) CIRCUIT FOR BIDIRECTIONAL DATA TRANSMISSION

TECHNICAL FIELD

The present invention relates generally to logic circuits, and more particularly to an apparatus that may be used as both an off chip driver and an on die termination for a current mode logic circuit.

BACKGROUND

When high-speed and low voltage swing data transfer is needed, differential signaling (also commonly referred to as double ended signals), wherein signals are carried on two conductors and the signal is defined as the difference in the two signals. Differential signaling is perhaps the most robust and promising signaling concept. Current mode logic (CML), a design technique commonly used in high speed signaling applications such as communications chips and routers, uses differential signaling.

CML is widely used in high-speed applications due to its relatively low power consumption and low supply voltage when compared to other types of logic, such as emitter coupled logic (ECL). CML is also considerably faster than CMOS logic due to its lower voltage swings. CML also has an added advantage of the capability of being fabricated using CMOS fabrication technology.

When a signal needs to be transmitted off-chip, a signal driver commonly referred to as an off chip driver (OCD) may be used. An OCD may be used to provide sufficient driving current in order to transmit the signal on a transmission line. Certain OCDs may also provide voltage compatibility conversions. In a CML OCD, resistors are used to provide a necessary voltage drop that is necessary to the operation of the CML circuit.

When a signal is received over a transmission line, it is desired that the transmission line be properly terminated with resistors of a desired value so that the optimum signal transfer be achieved. In most situations, the resistors will have the same value (or approximately the same value) as the resistance seen by the signals being transmitted over the transmission line. These termination resistors are commonly referred to as on die termination (ODT) resistors.

Unless a particular application communicates in only one direction (either transmit or receive), a typical solution would be to have separate OCD and ODT circuits for each transmission line used in the application.

One disadvantage of the prior art is that through the use of separate OCD and ODT circuits, more resistors are used. In integrated circuits, it can be relatively difficult to produce resistors of a specific desired value, especially if the resistance of the resistors is large. This may lead to a more expensive integrated circuit.

A second disadvantage of the prior art is that integrated resistors (especially resistors with large resistances) may be physically large in size. Therefore, the use of a relatively large number of resistors may result in an integrated circuit that is physically large. Additionally, the presence of the large resistors may make it more difficult to route and place circuitry in the integrated circuit.

SUMMARY OF THE INVENTION

These and other problems are generally solved or circumvented, and technical advantages are generally achieved, by preferred embodiments of the present invention which provides for an apparatus that may be used both as an off chip driver and as an on die termination.

In accordance with a preferred embodiment of the present invention, a circuit comprising a control circuit coupled to a signal line, the control circuit containing circuitry to enable off chip driver and on die termination functionality, a dual-function circuit coupled to the control circuit, the dual-function circuit containing circuitry to drive a signal from the signal line on a transmission line and to terminate incoming signals from the transmission line, and an enable signal line coupled to the control circuit, the enable signal line to carry a enable signal to turn the control circuit on and off.

In accordance with another preferred embodiment of the present invention, a circuit comprising a control circuit coupled to a signal line, the control circuit for use in enabling off chip driver and on die termination functionality, a dual-function circuit coupled to the control circuit, the dual-function circuit for use in transmitting signals onto a transmission line and receiving signals from the transmission line, and an enable signal line coupled to the control circuit, the enable signal line to provide a signal for selectively enabling off chip driver and on die termination functionality An advantage of a preferred embodiment of the present invention is that since the present invention may be used both as an off chip driver and as an on die termination, the physical size requirements may be reduced, therefore, making it easier to route and place the invention on an integrated circuit.

A further advantage of a preferred embodiment of the present invention is that the overall number of resistors used is reduced, and since resistors may be hard to create and may be large, the production of the integrated circuit may be simpler due to the reduction in the number of resistors needed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an integrated circuit using a current mode logic circuit to perform both as an off chip driver and as an on die termination circuit. The invention may also be applied, however, to other integrated circuits using other forms of logic where the desire is to have high-speed communications with emphasis placed upon minimizing size and costs by using multifunction circuitry.

Figures 1, 2A, 2B:
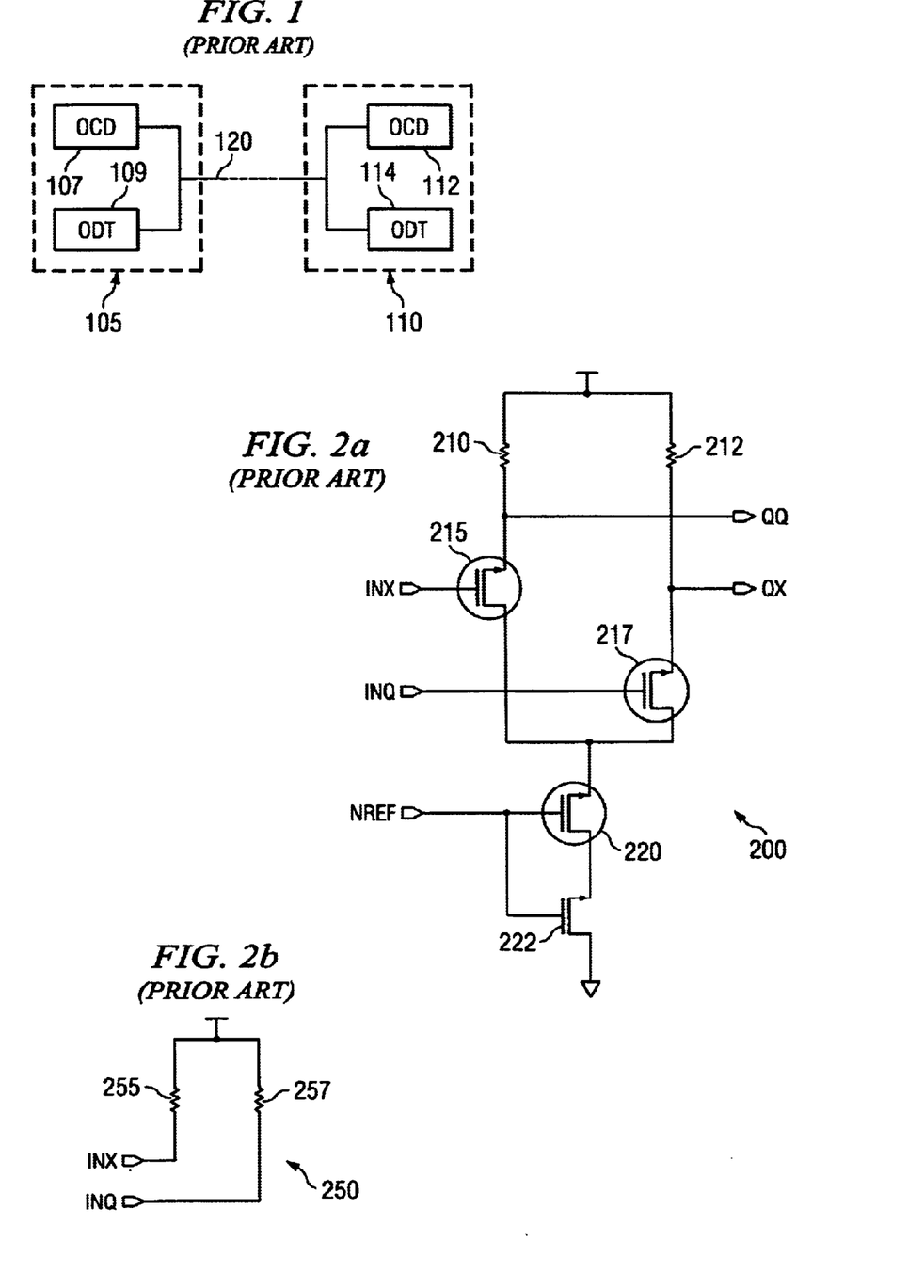
FIG. 1 is a diagram of a pair of integrated circuits that communicate with one via a transmission line.
FIGS. 2a and 2b are prior art diagrams of an off chip driver circuit and an on die termination circuit.

With reference now to FIG. 1, there is shown a diagram illustrating a pair of integrated circuits 105 and 110 that can communicate via a transmission line 120. The integrated circuits 105 and 110 may perform bidirectional communications with one another, i.e., each integrated circuit may transmit as well as receive communications. In order to communicate, each integrated circuit (for example, integrated circuit 105) has an off chip driver (OCD) circuit 107 that is coupled to the transmission line 120 as well as an on die termination (ODT) circuit 109 that is also coupled to the transmission line 120.

The OCD circuit 107 may be used to provide sufficient current to drive the signals over the transmission line 120 and/or voltage compatibility conversion to make the signals compatible with the transmission line 120. Additionally, the OCD circuit 107 and the ODT circuit 109 may be made from a different logic from the other portions of the integrated circuit 105. For example, the OCD and ODT circuits may be made from current mode logic (CML) while the remainder of the integrated circuit may be created from complementary metal oxide semiconductor (CMOS) logic. One possible reason for doing this is that CML circuitry may operate at a significantly higher frequency than CMOS circuitry. Therefore, to support high-speed communications, CML OCD and ODT circuits may be used. Unfortunately, CML circuitry can consume more power than CMOS circuits, especially when the circuitry is in standby. Therefore, CMOS circuits may be used in the integrated circuit to reduce power consumption where high frequency performance is not needed or where power consumption is of greater importance.

It is customary to use separate OCD and ODT circuits in applications where bidirectional communications is needed. This may be because it may be easier to design two separate circuits to perform the two different tasks than to design a single circuit to perform the two different tasks. However, two separate circuits may end up costing more in terms of room on the integrated circuit, greater fabrication complexity, higher production costs, and reduced efficiency.

With reference now to FIG. 2a, there is shown a diagram illustrating a schematic view of a prior art CML OCD 200.

The CML OCD 200 as displayed in FIG. 2a is a CML buffer and can be made from a pair of resistor/transistor combinations (for example, resistor 210 and transistor 215 would comprise one resistor/transistor combination). The resistor 210 would have a terminal coupled to a voltage supply, such as VDD, and another terminal coupled to the drain of the transistor 215. The signal being driven off chip would be coupled to the gate of the transistor 215 while the output of the CML OCD 200 would be taken from the drain of the transistor 215. Since the CML OCD 200 works with differential mode signals, a second resistor/transistor combination (for example, resistor 212 and transistor 217) is needed for the second component of the differential mode signal.

The source of the transistor 215 (along with the source of the transistor 217) is coupled to a reference current source. The reference current source is made from a pair of transistors 220 and 222. The transistors 220 and 222 are coupled drain to source and have their gates tied to a reference voltage, NREF. The reference current source is used to provide a current flow of known magnitude and polarity when a conductive path is created from the voltage supply to substrate ground. For example, when the signal coupled to the gate of transistor 215 is high, the transistor 215 is turned on and creates a conductive path from the voltage supply through the resistor 210 and the transistors 215, 220 and 222.

This conductive path permits the current to flow and a voltage drop is realized across the resistor 210. Due to the voltage drop across the resistor 210, the output of the CML OCD 200 would be at a lower voltage potential than the voltage supply. If the current path does not exist, then no voltage drop is realized across the resistor 210 and the output of the CML OCD 200 would be at the same voltage potential as the voltage supply. A similar situation occurs with the other component output of the CML OCD 200.

With reference now to FIG. 2b, there is shown a diagram illustrating a schematic view of a prior art CML ODT 250. An ODT may be as simple as a pair of conductive lines (the transmission lines for a differential mode signal) wherein each one of the conductive lines is coupled to a terminating resistor of specified value. FIG. 2b displays the transmission lines, labeled as "INX" and "INQ", and the transmission lines are coupled to terminating resistors 255 and 257. What may not be shown are signal detection hardware that is responsible for reading/detecting the signals transmitted on the transmission lines. Note that the transmission lines in FIGS. 2a and 2b may be labeled with the same names ("INX" and "INQ"), however, the names are for illustrative purposes and they may not be the same lines.

Figure 3:
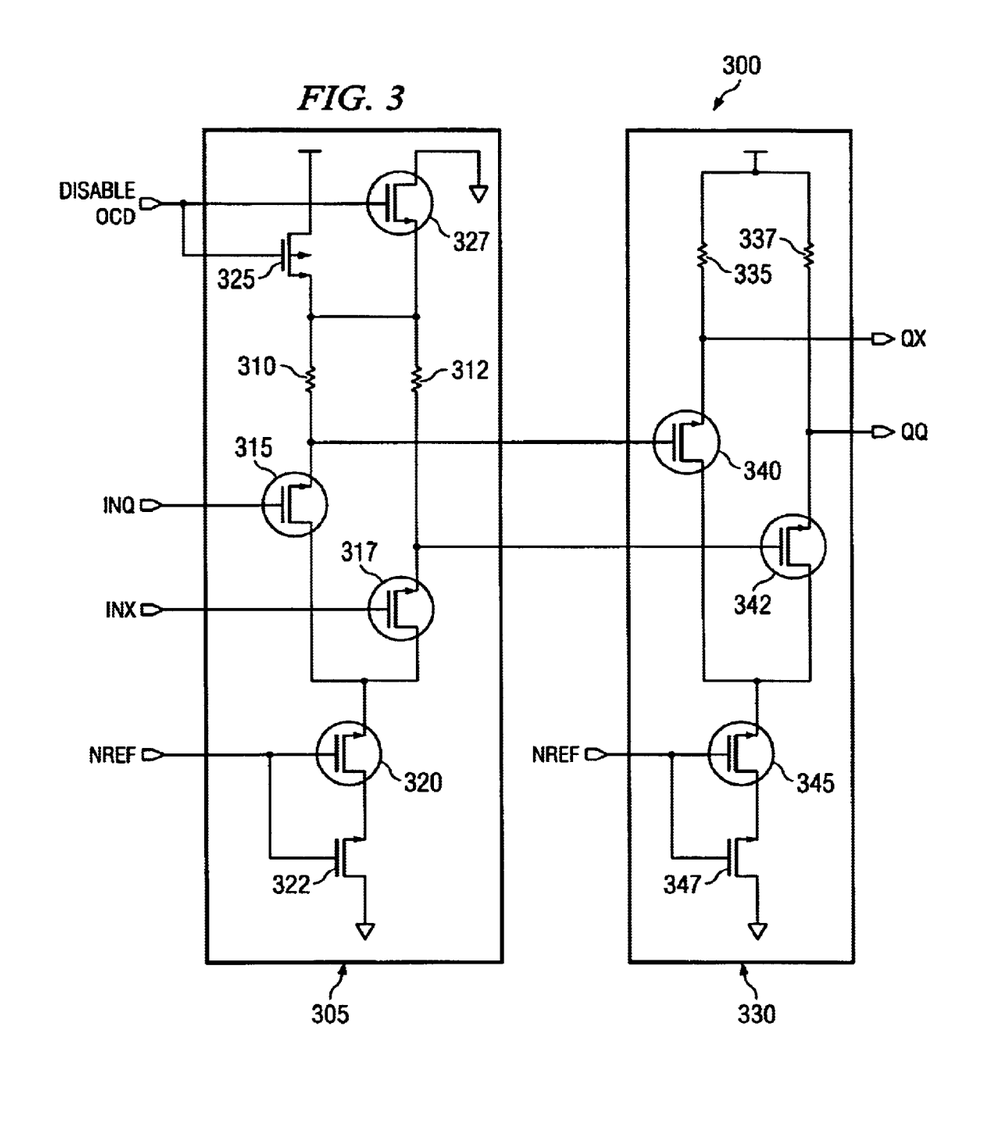
FIG. 3 is a diagram of a combination off chip driver circuit and an on die termination circuit, according to a preferred embodiment of the present invention.

With reference now to FIG. 3, there is shown a diagram illustrating a schematic view of a combination OCD/ODT circuit 300 that combines a CML OCD circuit and a CML ODT circuit into a single circuit, according to a preferred embodiment of the present invention. According to a preferred embodiment of the present invention, the combination OCD/ODT circuit 300 may be used as either an OCD or an ODT circuit and can take the place of individual OCD and ODT circuits, such as those displayed in FIGS. 2a and 2b.

According to a preferred embodiment of the present invention, the combination OCD/ODT circuit 300 may be partitioned into two distinct circuits, a control circuit 305 and a dual function OCD/ODT circuit 330. The control circuit 305 may be used to enable OCD and ODT functionality in the dual function OCD/ODT circuit 330 as well as being a conduit for a signal to be transmitted when the combination OCD/ODT circuit 300 may be functioning as an OCD circuit.

The control circuit 305, as displayed in FIG. 3, may be made up of a pair of resistor/transistor combinations (for example, resistor 310 and transistor 315) and a reference current source (made up of transistors 320 and 322) that may be coupled to the pair of resistor/transistor combinations. The control circuit 305 may have several inputs, including a signal to be transmitted (when the dual function OCD/ODT circuit 330 is operating as an OCD circuit) and an enable signal line, which may be used to specify the function of the OCD/ODT circuit 330.

The pair of resistor/transistor combinations (as described above) may be coupled to a pair of transistors (transistors 325 and 327). According to a preferred embodiment of the present invention, transistor 325 is preferably a P-channel MOSFET (metal oxide semiconductor field effect transistor) while transistor 327 is an N-channel MOSFET. The drain of the transistor 325 may be coupled to a first terminal of the two resistors in the pair of resistor/transistor combinations, while the source of the transistor 325 may be couple to a voltage supply, such as VDD. The transistor 327, which may be coupled to the resistors in the pair of resistor/transistor combinations in a parallel fashion with respect to the transistor 325, may have its source coupled to substrate ground. Both transistors 325 and 327 may have their gates coupled to the enable signal line, "DISABLE OCD.".

A "DISABLE OCD" enable signal, carried on the "DISABLE OCD" enable signal line, may be used to selectively choose either OCD or ODT functionality for the combination OCD/ODT circuit 300. The operation of the "DISABLE OCD" enable signal and how it affects the function of the combination OCD/ODT circuit 300 will be discussed below.

The dual function OCD/ODT circuit 330 may also be similar in appearance to a CML buffer. Again, the dual function OCD/ODT circuit 330 may be created from a pair of resistor/transistor combinations (for example, resistor 335 and transistor 340), with each of the two resistors in the pair of resistor/transistor combinations (resistors 335 and 337) being coupled to a voltage supply. The transistors from the pair of resistor/transistor combinations (transistors 340 and 342) may have their sources coupled to a reference current source, which may be made from transistors 345 and 347. The gates of the transistors 340 and 342 may serve as input to the dual function OCD/ODT circuit 330 and may be coupled to the outputs provided by the control circuit 305. Output of the OCD/ODT circuit 330 may be taken from the drains of the transistors 340 and 342. Note that the dual function OCD/ODT circuit 330 is described herein is one particular implementation of a CML buffer, the dual function OCD/ODT circuit 330 may be implemented differently and the present invention will remain operable.

Note that as displayed in FIG. 3, the transistors used in the design of the combination OCD/ODT circuit 300 may be N-channel MOSFETs with the exception of transistor 325, which may be a P-channel MOSFET. However, it may be possible to redesign the combination OCD/ODT circuit 300, wherein different types of transistors are used. For example, the N-channel MOSFETs may be switched for P-channel MOSFET and transistor 325 may be replaced with a N-channel MOSFET with small modifications to the design of the combination OCD/ODT circuit 300 as shown.

FIG. 3 displays a combination OCD/ODT circuit 300 whose behavior may change depending upon a value asserted on the "DISABLE OCD" enable signal line. For example, if a low signal value is asserted on the "DISABLE OCD" enable signal line (assuming that the "DISABLE OCD" signal assumes a logic true value when the signal line has a high signal value), then the combination OCD/ODT circuit 300 may operate as a OCD circuit and if a high signal value is asserted on the "DISABLE OCD" enable signal line, then the combination OCD/ODT circuit 300 may operate as a ODT circuit.

Figure 4:
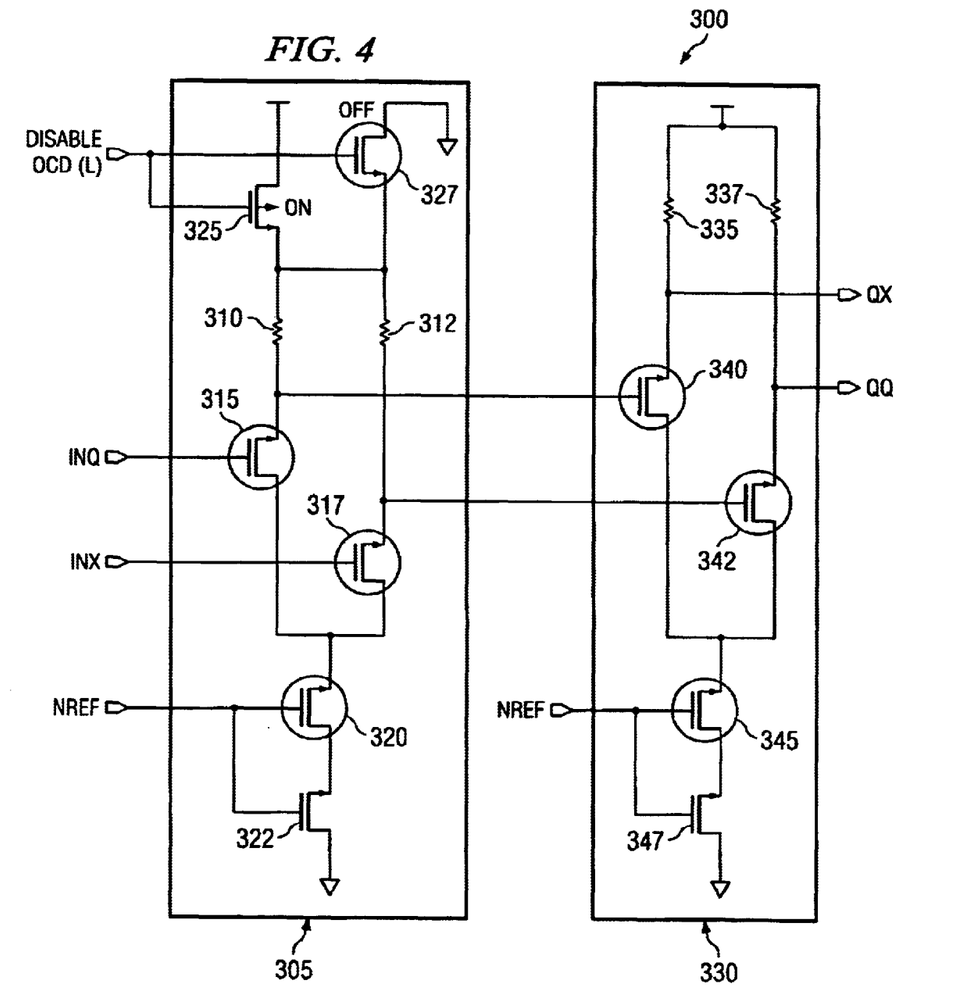
FIG. 4 is a diagram of a combination off chip driver circuit and an on die termination circuit when operating as an off chip driver circuit, according to a preferred embodiment of the present invention.

With reference now to FIG. 4, there is shown a combination OCD/ODT circuit operating as a OCD circuit when a "DISABLE OCD" enable signal line has asserted a logic false value (for example, a low voltage level), according to a preferred embodiment of the present invention. According to a preferred embodiment of the present invention, when the "DISABLE OCD" enable signal line has a logic false value (which may be represented as a low voltage level at or near substrate ground), the pair of transistors (transistors 325 and 327) to which it may be may either turn on or off depending upon the transistors' type. For example, transistor 325, which is preferably a P-channel MOSFET, may be turned ON, while transistor 327 (preferably an N-channel MOSFET) may be turned OFF.

With transistor 325 turned ON and behaving as a closed circuit, the resistors 310 and 312 of the control circuit 305 may be coupled to the voltage supply to which the transistor 325 may be coupled. Since the transistor 327 may be OFF and therefore behaving as an open circuit, the substrate ground to which the transistor 327 may be coupled behaves as if it were not coupled to the remainder of the control circuit 305. Being coupled to a voltage supply, the remainder of the control circuit 305 may behave in a fashion that is similar to a generic CML buffer, taking a differential signal at its input and providing an inverted version of the signal (perhaps with a small propagation delay inserted) at its output.

The input signal to the combination OCD/ODT circuit 300, "INQ" and "INX", may then propagate through the control circuit 305 and to the combination OCD/ODT circuit 330, which may be operating as an OCD circuit (due to the value asserted on the "DISABLE OCD" enable signal line), and be transmitted via a differential mode transmission line to off chip devices.

Figure 5A:
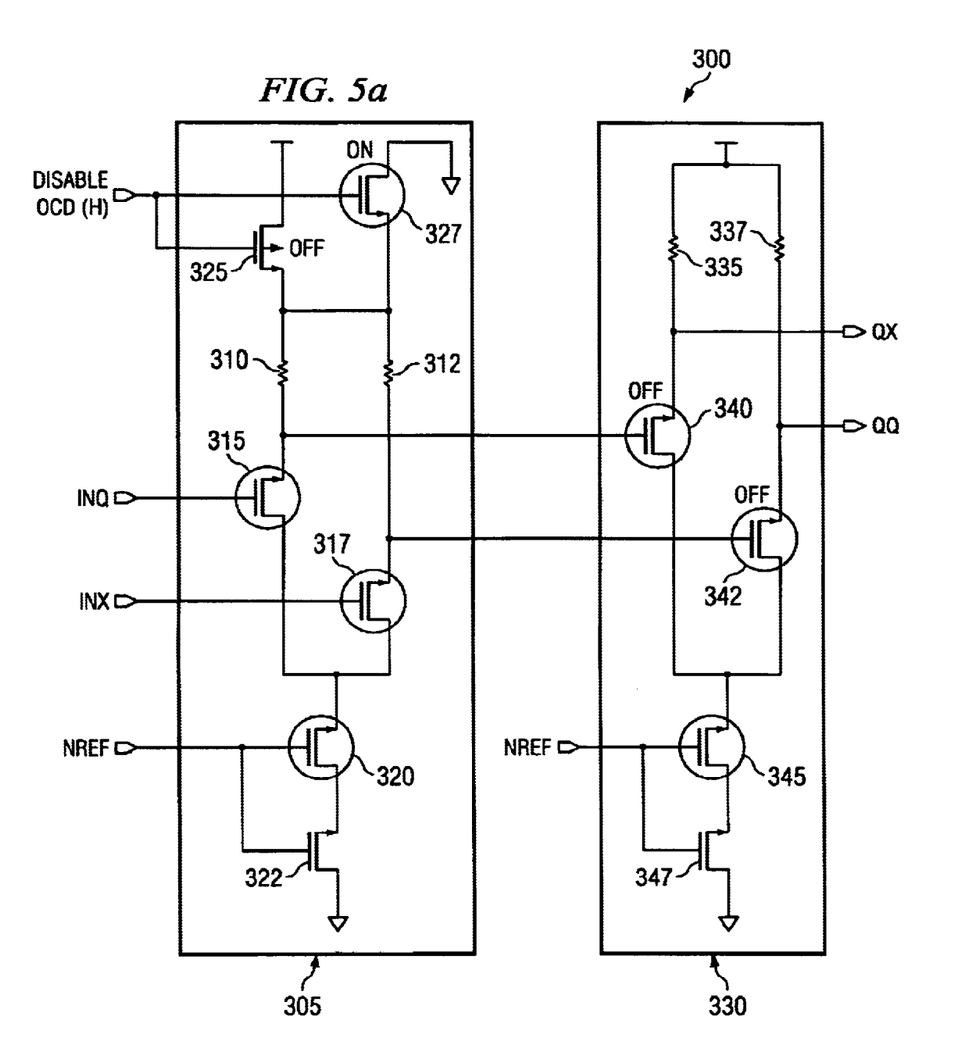
FIGS. 5a and 5b are diagrams of a combination off chip driver circuit and an on die termination circuit when operating as an on die termination circuit, according to a preferred embodiment of the present invention.

With reference now to FIG. 5a, there is shown a combination OCD/ODT circuit operating as a ODT circuit when a "DISABBLE OCD" enable signal line has asserted a logic true value (for example, a high voltage level), according to a preferred embodiment of the present invention. According to a preferred embodiment of the present invention, when the "DISABLE OCD" enable signal line has a logic true value (which may be represented as a high voltage level at or near the voltage supply), the pair of transistors 325 and 327 to which it may be coupled may either turn on or off depending on the transistors' type. For example, transistor 325 (preferably a P-channel MOSFET) may turn OFF, while transistor 327 (preferably an N-channel MOSFET) may turn ON.

When the transistor 325 is turned OFF and behaving as an open circuit, the voltage supply to which it may be coupled is effectively decoupled from the remainder of the control circuit 305. However, when the transistor 327 is turned ON and behaving as a closed circuit, the substrate ground to which it may be coupled is coupled to the remainder of the control circuit 305. Note however that at the other end of the remainder of the control circuit 305 may be a reference current source (made from transistors 320 and 322) that also may be coupled to the substrate ground. With both ends of the control circuit 305 being coupled to substrate ground, no voltage potential exists. Therefore, the control circuit 305 appears as if it does not exist.

With the control circuit 305 at a voltage potential at or near substrate ground, the input to the transistors 340 and 342 may also be at or near substrate ground, turning both transistors OFF (since according to a preferred embodiment of the present invention, the transistors 340 and 342 may be N-channel MOSFETs). With the control circuit 305 turned OFF (due to a lack of a voltage potential), the input signals "INQ" and "INX" may now be effectively decoupled from the transmission line (not shown). The combination OCD/ODT circuit 330 may now function as an ODT circuit and receive signals transmitted over the transmission line with the resistors 335 and 337 operating as terminating resistors.

Figure 5B:
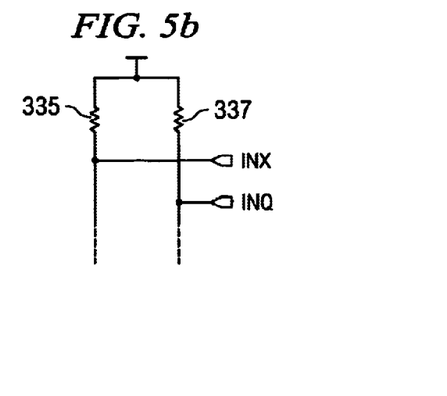

With reference now to FIG. 5b, there is shown a diagram illustrating the combination OCD/ODT circuit 330 when operating as an ODT circuit, according to a preferred embodiment of the present invention. When the control circuit 305 is turned OFF by a, high logic value asserted on the "DISABLE OCD" enable signal line, the combination OCD/ODT circuit 300 effectively becomes a pair of resistors 335 and 337 that may be coupled to the transmission line. The resistors 335 and 337 may be used as terminating resistors to properly terminate a transmission line. Note that the labels for the signals on the transmission line, "INQ" and "INX", though similar to the labels for the input signals (displayed in FIG. 3), may not be indicative that the signals are the same.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a control circuit for receiving a pair of differential mode signals and providing said differential mode signals on a pair of input signal lines, the control circuit further containing circuitry to exclusively enable one of off chip driver functionality or and on die termination functionality in response to an enable/disable signal;
   a dual-function circuit coupled to the control circuit, the dual-function circuit containing circuitry to drive a differential mode signals received on the pair of input signal lines onto a pair of differential mode transmission lines and to terminate incoming signals arriving on the pair of differential mode transmission lines; and
   an enable signal line coupled to the control circuit, the enable signal line to carry a said enable/disable signal to said control circuit.

2. The circuit of claim 1, wherein the control circuit comprises:
   an on/off circuit coupled to the enable signal line;
   a buffer comprising
      a first and a second resistor, each resistor having a first terminal coupled to the on/off circuit;
      a first and a second transistor, the first transistor having a first terminal coupled to a second terminal of the first resistor and to one of said pair of input signal lines, the second transistor having a first terminal coupled to a second terminal of the second resistor and the other one of said pair of input signal lines, the two transistors having second terminals coupled together, and the two transistors having third terminals coupled to the signal line.

3. The circuit of claim 2, wherein the on/off circuit comprises:
   a third transistor having a first terminal coupled to the buffer, a second terminal coupled to a voltage supply, a third terminal coupled to the enable signal line; and
   a fourth transistor having a first terminal coupled to the buffer, a second terminal coupled to a substrate ground, a third terminal coupled to the enable signal line.

4. The circuit of claim 3, wherein when the enable signal line has a logic value of true, the control circuit enables the dual-function circuit to operate as an on die termination circuit and terminate incoming signals from the transmission line.

5. The circuit of claim 4, wherein when the enable signal line has a logic value of true, the third transistor turns off and the fourth transistor turns on, coupling the buffer to the substrate ground.

6. The circuit of claim 3, wherein when the enable signal line has a logic value of false, the control circuit enables the dual-function circuit to operate as an off chip driver circuit and drive the signal on the signal line on the transmission line.

7. The circuit of claim 6, wherein when the enable signal line has a logic value of false, the fourth transistor turns off and the third transistor turns on, coupling the buffer to the voltage supply.

8. The circuit of claim 3, wherein the third transistor is a P-channel MOSFET (metal oxide semiconductor field effect transistor) and the fourth transistor is an N-channel MOSFET.

9. The circuit of claim 2, wherein a transistor has three terminals, the first terminal is a drain of the transistor, the second terminal is a source of the transistor, and the third terminal is a gate of the transistor.

10. The circuit of claim 2, wherein the control circuit further comprises a reference current supply coupled to the second terminals of the first and second transistors.

11. The circuit of claim 2, wherein the control circuit is a current mode logic (CML) circuit.

12. The circuit of claim 1, wherein the dual-function circuit comprises:
   a first and a second resistor, each resistor having a first terminal coupled to a voltage supply and a second terminal coupled one each to said pair of input signal lines;
   a first and a second transistor, the first transistor having a first terminal coupled to said second terminal of the first resistor, the second transistor having a first terminal coupled to said second terminal of the second resistor, the two transistors having second terminals coupled together, and the two transistors having third terminals coupled to an output of the control circuit.

13. The circuit of claim 12, wherein when the control circuit enables on die termination functionality, the third terminals of the first and second transistors are pulled to a substrate ground.

14. The circuit of claim 13, wherein when the gates of the first and second transistors are pulled to the substrate ground, the first and second resistors become terminating resistors for incoming signals from the transmission line.

15. The circuit of claim 14 wherein the incoming signals from the transmission line are differential mode signals.

16. The circuit of claim 15, wherein when the gates of the first and second transistors are pulled to the substrate ground, the first and second resistors are decoupled from the reference current source.

17. The circuit of claim 12, wherein when the control circuit enables off chip driver functionality, the third terminals of the first and second transistors are pulled to a voltage supply.

18. The circuit of claim 17, wherein when the control circuit enables off chip driver functionality, a signal at the signal line coupled to the control circuit is provided to the third terminals of the first and second transistors.

19. The circuit of claim 12, wherein the dual-function circuit further comprises a reference current source coupled to the second terminals of the first and second transistors.

20. The circuit of claim 1, wherein the dual-function circuit is a current mode logic buffer.

21. Circuitry for providing CML (current mode logic) OCD (off chip driver) and ODT (on die termination) for bidirectional data transmission comprising:
   an on/off circuit having an output, said on/off circuit for switching said output between a voltage source and a ground in response to an enable/disable signal;
   an enable/disable signal line connected to said on/off circuitry for receiving said enable/disable sign;
   an OCD (off chip driver) for driving differential mode signals onto a pair of transmission lines, said driver comprising control circuitry and a pair of reference resistors, said reference resistors connected to said pair of transmission lines and to said control circuitry, said control circuit having a pair of inputs for receiving the differential mode signals that are driven on to said transmission lines; and
   a buffer circuit connected to said on/off circuit output and further connected between a differential mode signal source and said pair of inputs of said OC driver circuit, said buffer circuit providing said differential mode signals received from said signal source to said OC driver circuit when said voltage source is connected to said on/off circuit output and isolating said pair of transmission lines from said pair of inputs for receiving said differential mode signals and from said control circuitry of said OCD (off chip driver) circuit when said ground is connected to said on/off circuit output, such that said reference resistors function as termination resistors.

22. A circuit comprising:
   a control circuit for receiving a pair of differential mode signals and providing said differential mode signals on a pair of input signal lines, the control circuit comprising circuitry to exclusively enable one of off chip driver functionality or on die termination functionality in response to an enable/disable signal, said control circuit comprising:
      an on/off circuit coupled to the enable signal line,
      a buffer including a first and a second resistor, each resistor having a first terminal coupled to the on/off circuit and a first and a second transistor, the first transistor having a first terminal coupled to a second terminal of the first resistor and a to one of said pair of input lines, the second transistor having a first terminal coupled to a second terminal of the second resistor and the other one of said pair of input signal lines, the two transistors having second terminals coupled together, and the two transistors having third terminals coupled to the signal line;
   a dual-function circuit coupled to control circuit, the dual-function circuit containing circuitry for driving said differential mode signals provided on the pair of input signal lines onto a pair of differential mode transmission lines and to terminate incoming signals from the pair of differential mode transmission lines; and
   an enable signal line coupled to the control circuit, the enable signal line to carry said enable/disable signal to said control circuit.

23. The circuit of claim 22, wherein the dual-function circuit comprises:
   a third and a fourth resistor having a first terminal coupled to a voltage supply;
   a third and a fourth transistor, the third transistor having a first terminal coupled to a said second terminal of the third resistor, the fourth transistor having a first terminal coupled to said second terminal of the fourth resistor, the two transistors having second terminals coupled to said together, and the two transistors having third terminals coupled to an output of the control circuit.

24. The circuit of claim 23, wherein when the control circuit enables on die termination functionality, the third terminals of the third and fourth transistors are pulled to a substrate ground.

25. The circuit of claim 24, wherein when the gates of the third and fourth transistors are pulled to the substrate ground, the third and fourth resistors are decoupled firm the reference current source.

26. The circuit of claim 24, wherein when the gates of the third and fourth transistors are pulled to the substrate ground, the third and fourth resistors become terminating resistors for incoming signals from the transmission line.

27. The circuit of claim 23, wherein the dual-function circuit further comprises a reference current source coupled to the second terminals of the third and fourth transistors.

28. The circuit of claim 23, wherein when the control circuit enables off chip driver functionality, the third terminals of the first and second transistors are pulled to a voltage supply.

29. The circuit of claim 22, wherein the on/off circuit comprises:
   a third transistor having a first terminal coupled to the buffer, a second terminal coupled to a voltage supply, a third terminal coupled to the enable signal line; and
   a fourth transistor having a first terminal coupled to the buffer, a second terminal coupled to a substrate ground, a third terminal coupled to the enable signal line.

* * * * *

UNITED STATES PATENT AND TRADEMARK OFFICE
CERTIFICATE OF CORRECTION

PATENT NO. : 6,847,225 B2
DATED : January 25, 2005
INVENTOR(S) : Viehmann et al.

It is certified that error appears in the above-identified patent and that said Letters Patent is hereby corrected as shown below:

Column 7,
Line 57, delete "a".

Column 9,
Line 7, delete "15" and insert -- 13 --.

Column 10,
Line 5, delete "a".
Line 31, delete "said".

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,847,225 B2 |
| APPLICATION NO. | : 10/394779 |
| DATED | : January 25, 2005 |
| INVENTOR(S) | : Viehmann et al. |

Page 1 of 1

It is certified that error appears in the above-identified patent and that said Letters Patent is hereby corrected as shown below:

In Col. 7, line 54, delete "or and" and insert --or--.

Signed and Sealed this

Eighteenth Day of March, 2008

JON W. DUDAS
*Director of the United States Patent and Trademark Office*